United States Patent
Higashi

(10) Patent No.: US 8,076,206 B2
(45) Date of Patent: Dec. 13, 2011

(54) METHOD FOR MANUFACTURING SONOS FLASH MEMORY

(75) Inventor: Masahiko Higashi, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 651 days.

(21) Appl. No.: 12/193,266

(22) Filed: Aug. 18, 2008

(65) Prior Publication Data

US 2009/0209076 A1     Aug. 20, 2009

(30) Foreign Application Priority Data

Aug. 17, 2007   (JP) .................................. 2007-213001

(51) Int. Cl.
*H01L 21/336*        (2006.01)
(52) U.S. Cl. .. 438/287; 438/257; 438/264; 257/E21.423

(58) Field of Classification Search .................. 438/257, 438/264, 287

See application file for complete search history.

(56) References Cited

U.S. PATENT DOCUMENTS

| | | | |
|---|---|---|---|
| 7,732,276 B2 * | 6/2010 | Fang et al. | 438/257 |
| 2007/0045720 A1 * | 3/2007 | Kouketsu et al. | 257/324 |
| 2008/0230830 A1 * | 9/2008 | Kim et al. | 257/324 |

* cited by examiner

*Primary Examiner* — Alexander Ghyka

(57) ABSTRACT

A method for manufacturing a semiconductor device which includes steps of forming a dummy layer on a semiconductor substrate, forming a groove 12 in the semiconductor substrate while using the dummy layer as a mask, forming a tunnel insulating film and a trap layer to cover an inner surface of the groove and the dummy layer, eliminating the trap layer formed above the upper surface and at the sides of the dummy layer, and forming a top insulating film to cover a remaining trap layer and the exposed tunnel insulating film.

10 Claims, 13 Drawing Sheets

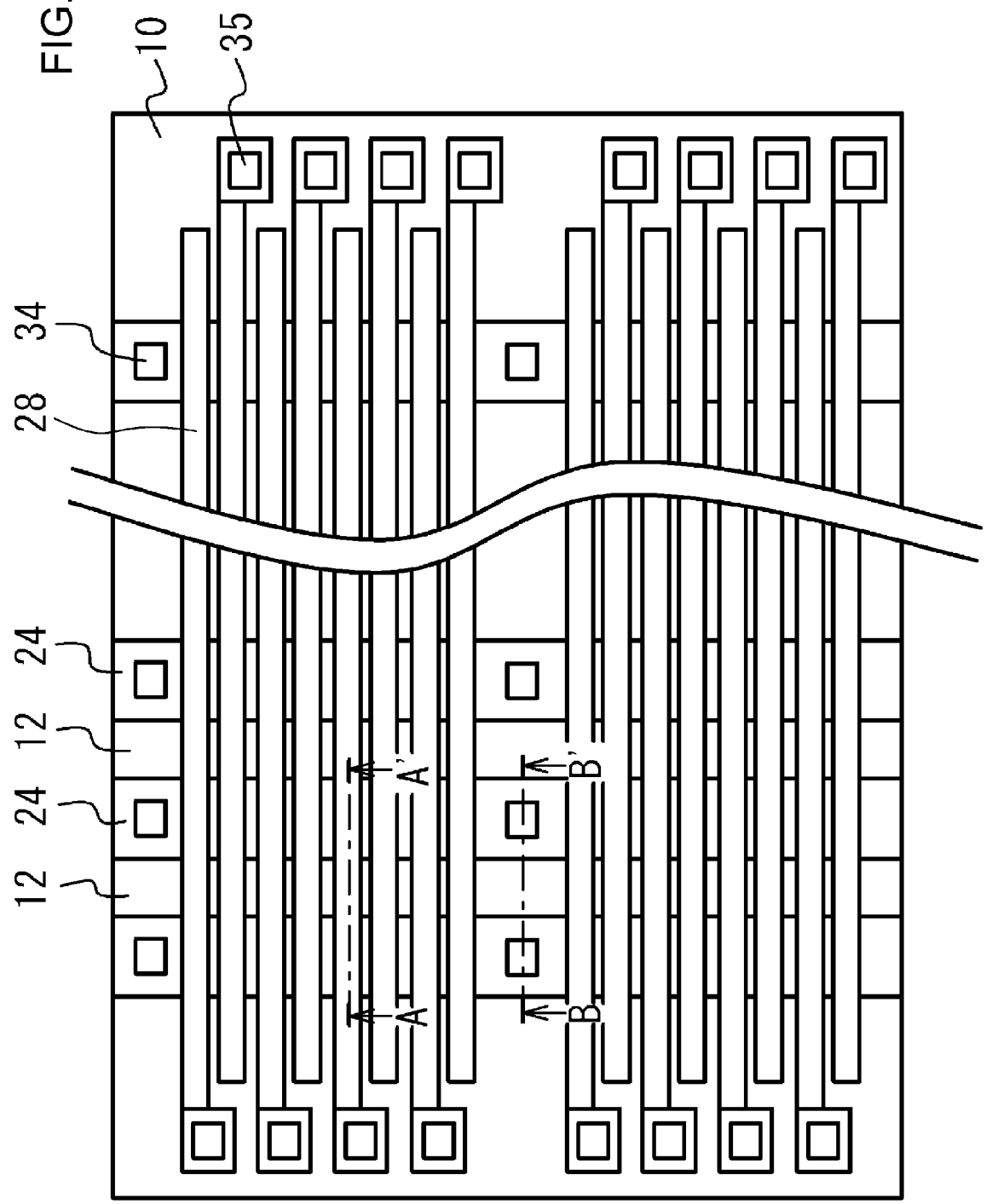

METHOD FOR MANUFACTURING SONOS FLASH MEMORY

CLAIM OF PRIORITY

This application claims priority from Japanese patent application 2007-213001 filed on Aug. 17, 2007.

TECHNICAL FIELD OF THE INVENTION

This invention relates to a method for manufacturing a semiconductor device. More particularly, this invention relates to a method for manufacturing a semiconductor device having a trap layer on a side surface of a groove formed in a semiconductor substrate.

BACKGROUND OF THE INVENTION

Recently, the usage of non-volatile memory comprising a semiconductor device capable of rewriting data and retaining data stored therein even while the device is un-powered has become increasingly popular. Flash memory is one example of non-volatile memory. A typical flash memory is provided with a transistor which operates as a memory cell and includes a floating gate or an insulating film called a charge storage layer for accumulating electrons used to store data. Flash memory with a SONOS (Silicon Oxide Nitride Oxide Silicon) structure for accumulating the electrons in a trap layer of an ONO (Oxide Nitride Oxide) film has been introduced as a flash memory using an insulating film as the charge storage layer.

A technique for forming the ONO film on the side surface of a groove formed in the semiconductor substrate has been developed to miniaturize the memory cell. PCT International Application No. 2005-525695 discloses a method for manufacturing the flash memory having the aforementioned groove as described below. According to PCT International Application No. 2005-525695, the trench is formed in the semiconductor substrate while using the auxiliary layer formed of the nitride film as a mask. Thus, the ONO film is formed on the wall of the trench. The gate electrode (formed of polysilicon) is formed in the trench. The auxiliary layer is eliminated to form the source/drain region in the semiconductor substrate while using the gate electrode as the mask. The insulating film is then formed on the source/drain region and the word line is formed on the insulating layer. The source/drain region may be formed after forming the ONO film. The insulating layer may be used to electrically separate the source/drain region from the word line.

However, according to this technique, the trap layer constituting the ONO film is eroded while eliminating a dummy layer used as a mask to form the groove. The level of the erosion varies depending on the individual wafer or the manufacturing lot. Occasionally, the trap layer may become sufficiently eroded so as to interfere with the stable operation of the flash memory.

SUMMARY OF THE INVENTION

It is an object of the invention to suppress erosion of the trap layer upon elimination of the dummy layer.

According to an aspect of the present invention, there is provided a method for manufacturing a semiconductor device comprising" forming a dummy layer on a semiconductor substrate, forming a groove in the semiconductor substrate while using the dummy layer as a mask, forming a tunnel insulating film and a trap layer to cover an inner surface of the groove and the dummy layer, eliminating the trap layer formed above an upper surface, and at sides of the dummy layer, and forming a top insulating film to cover a remaining trap layer and an exposed tunnel insulating film. In the method, the trap layer is covered with the top insulating film so as to suppress erosion of the trap layer.

In one embodiment, eliminating the trap layer may comprise forming a bury layer in the groove to expose the trap layer at the sides of the dummy layer, and eliminating the trap layer while using the bury layer as a mask. This makes it possible to eliminate the trap layer formed above the upper surface and at sides of the dummy layer.

In another embodiment, forming a bury layer may comprise forming a layer to be formed as the bury layer to fill the groove and to cover the trap layer, and eliminating the layer to be formed as the bury layer to expose at least the trap layer at the sides of the dummy layer. This makes it possible to form the bury layer in the groove so as to expose the trap layer at the sides of the dummy layer.

In alternate embodiments, the method may further comprise eliminating the dummy layer, and forming a bit line in the semiconductor substrate between the grooves where the dummy layer has been eliminated. This makes it possible to form the bit line after forming the top insulating film.

In still further embodiments, the method may also comprise forming a gate electrode buried in the groove on the top insulating film. Forming the bit line may, for example, comprise performing an ion implantation to the semiconductor substrate while using the gate electrode as a mask.

In one embodiment, forming the gate electrode may comprise forming a layer to be formed as a gate electrode to fill the groove and to cover the top insulating film, and polishing the layer to be formed as the gate electrode to be flush with the dummy layer.

In alternate embodiments, the method may further comprise forming an insulating layer on the bit line to expose an upper surface of the gate electrode, and forming a word line which is coupled to the gate electrode and intersects with the bit line in an extension direction thereof on the insulating layer. In one embodiment, the word line is electrically coupled with the gate electrode, and is separated from the bit line via the insulating layer.

The method may also comprise forming a metal silicide layer on the bit line between the grooves where the dummy layer has been eliminated. This makes it possible to reduce the bit line resistance.

According to one embodiment, the same material may be used for forming the dummy layer and the trap layer, for example, a silicon nitride may be used for forming the dummy layer and the trap layer.

In various embodiments of the aforementioned method, the trap layer is covered with the top insulating film so as to suppress erosion of the trap layer.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 1 is a top view of an exemplary flash memory in accordance with various embodiments of the present invention;

DETAILED DESCRIPTION

Reference will now be made in detail to several embodiments. While the subject matter will be described in conjunction with the alternative embodiments, it will be understood that they are not intended to limit the claimed subject matter to these embodiments. On the contrary, the claimed subject matter is intended to cover alternative, modifications, and equivalents, which may be included within the spirit and scope of the claimed subject matter as defined by the appended claims.

Furthermore, in the following detailed description, numerous specific details are set forth in order to provide a thorough understanding of the claimed subject matter. However, it will be recognized by one skilled in the art that embodiments may be practiced without these specific details or with equivalents thereof. In other instances, well-known methods, procedures, and components, have not been described in detail as not to unnecessarily obscure aspects and features of the subject matter.

FIG. 1 is a top view of an exemplary flash memory in accordance with various embodiments of the present invention. A plurality of bit lines 24 are formed on a semiconductor substrate 10, and grooves 12 are provided between the adjacent bit lines 24. A plurality of word lines 28 are arranged so as to intersect with the bit lines 24. The bit lines 24 and the word lines 28 are coupled to plug metals 34 and 35, respectively. The plug metals 34 and 35 are further coupled to the wiring layers (not shown).

The method for manufacturing the exemplary flash memory according to FIG. 1 will be described referring to FIGS. 2(a) to 4(c). FIGS. 2(a) to 3(b) correspond to sectional views taken along lines A-A' and B-B' shown in FIG. 1, respectively. FIGS. 4(a) and 5(a) correspond to sectional views taken along line A-A' shown in FIG. 1, and FIGS. 4(b) and 5(b) correspond to sectional views taken along line B-B' shown in FIG. 1, respectively.

Figure 2A:
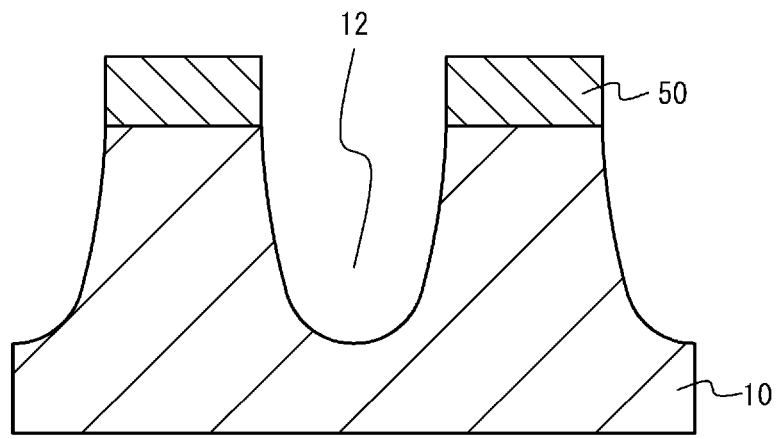
FIGS. 2(*a*) to 2(*c*) are sectional views showing the formation of a dummy layer in a conventional process for manufacturing an exemplary flash memory.
Figure 2B:
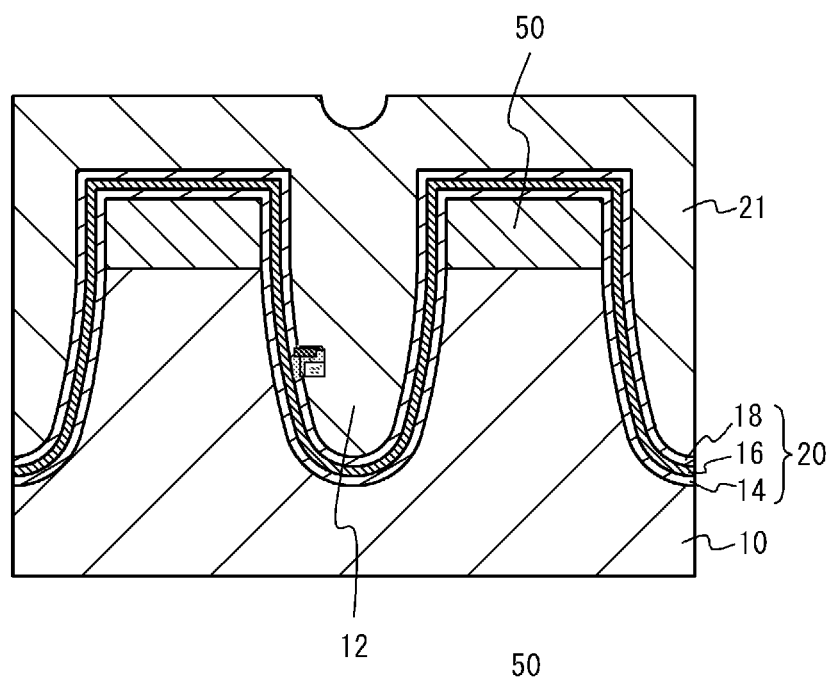
Figure 2C:
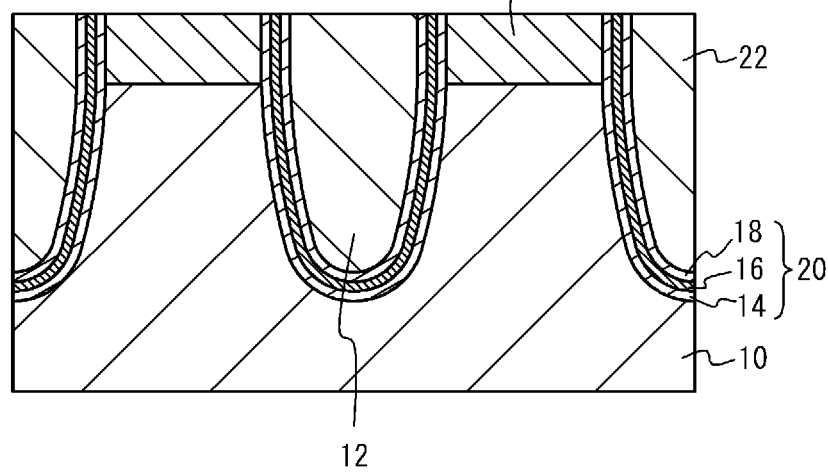

Referring to FIG. 2(a), a dummy layer 50 including a patterned silicon nitride film is formed on the semiconductor substrate 10. The semiconductor substrate 10 is etched while using the dummy layer 50 as a mask to form the groove 12. Referring to FIG. 2(b), a tunnel insulating film 14 including a silicon oxide film, a trap layer 16 including a silicon nitride film, and a top insulating film 18 including the silicon oxide film are formed to cover the inner surface of the groove 12 and the dummy layer 50. The tunnel insulating film 14, the trap layer 16 and the top insulating film 18 constitute an ONO film 20. A gate-electrode-forming layer 21 is formed to cover the ONO film 20 and to fill the groove 12. Referring to FIG. 2(c), the gate-electrode-forming layer 21 is polished until the upper surface of the dummy layer 50 is exposed. At this time, the dummy layer 50 serves as a stopper of the polishing.

Figure 3A:
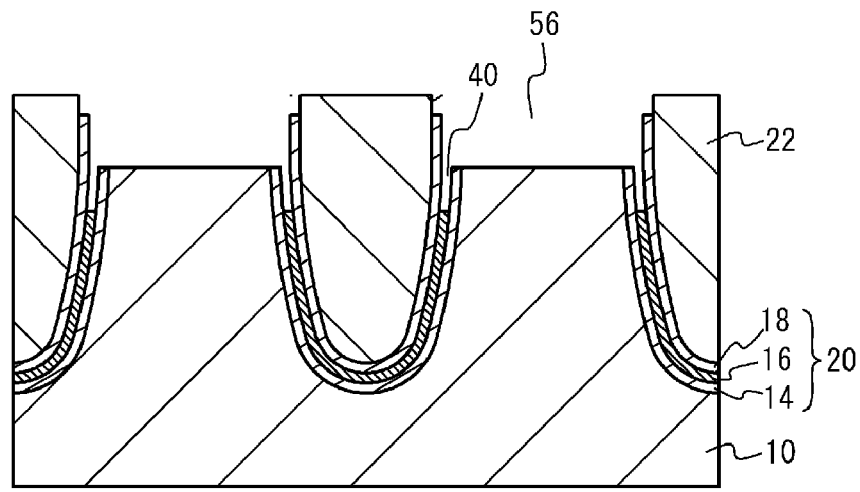
FIGS. 3(a) and 3(b) are sectional views showing the elimination of a dummy layer in a conventional process for manufacturing a flash memory.
Figure 3B:
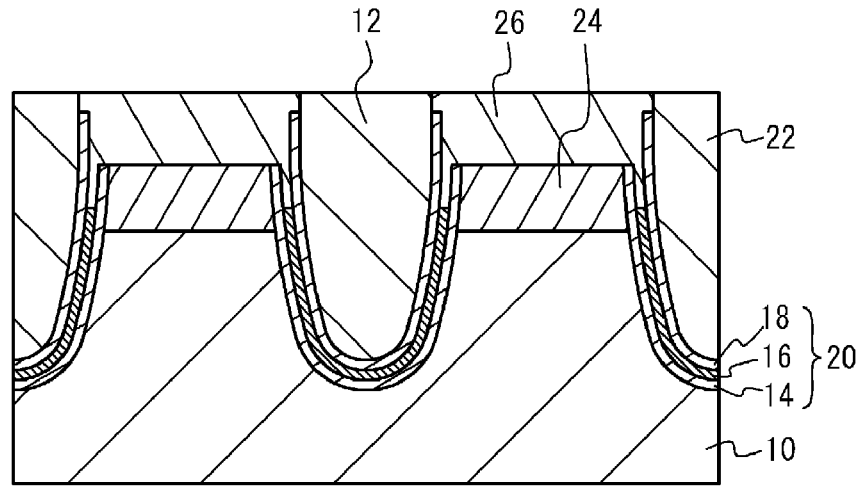
Figure 4A:
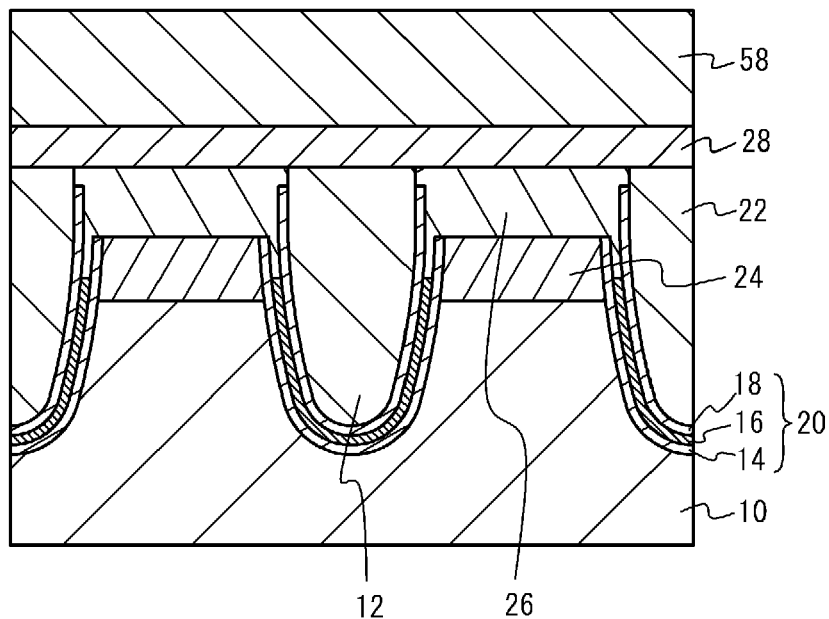
FIGS. 4(a) and 4(b) are sectional views showing the formation of a word-line-forming layer in a conventional process for manufacturing a flash memory.

Referring to FIG. 3(a), the phosphoric acid is used to eliminate the dummy layer 50. As a result, a recess portion 56 is formed in a portion where the dummy layer 50 is eliminated. Referring to FIG. 3(b), the semiconductor substrate 10 as the bottom surface of the recess portion 56 is ion implanted to form the bit line 24. The recess portion 56 is filled to form an insulating layer 26.

Figure 4B:
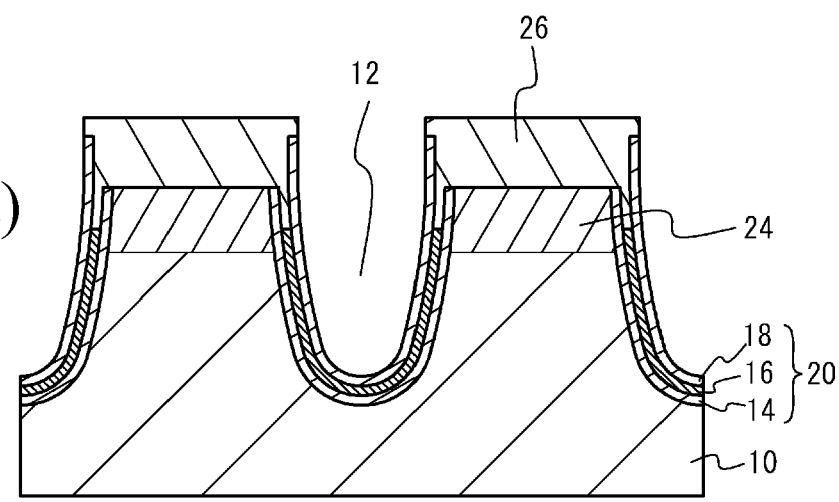
Figure 5A:
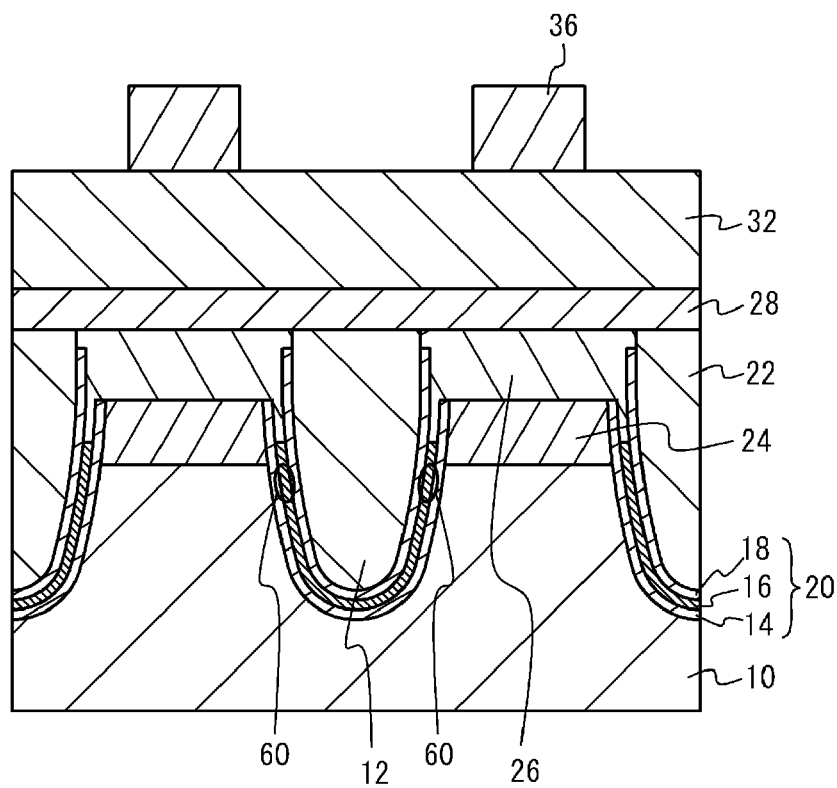
FIGS. 5(a) and 5(b) are sectional views showing the formation of an interlayer insulating film formed on a word line in a conventional process for manufacturing a flash memory in accordance with various embodiments.

Referring to FIGS. 4(a) and 4(b), a word-line-forming layer (not shown) is formed on the entire surfaces of a gate electrode 22 and the insulating layer 26. A patterned photoresist 58 is formed on the word-line-forming layer. The word line 28 and the gate electrode 22 are eliminated while using the photoresist 58 as the mask. As a result, the word line 28 which intersects with the bit line 24 is formed as shown by the cross-section along line A-A' of FIG. 4(a). The word line 28 is electrically in contact with the gate electrode 22, and is electrically separated from the bit line 24 via the insulating layer 26. The word line 28 and the gate electrode 22 are eliminated as shown by the cross-section along line B-B' shown in FIG. 4(b).

Figure 5B:
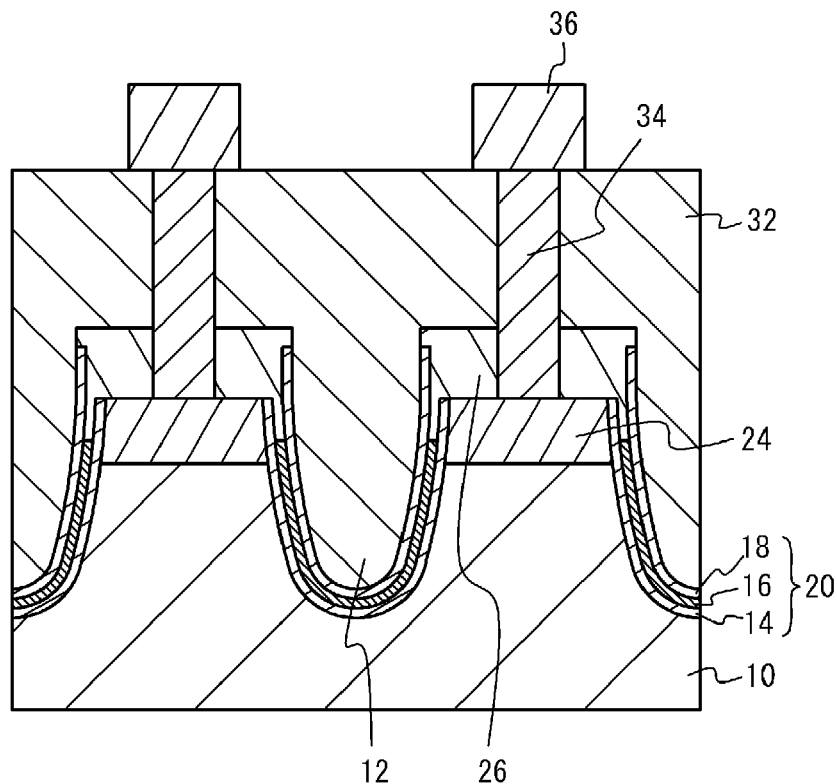

Referring to FIG. 5(a), an interlayer insulating film 32 is formed on the word line 28, and referring to FIG. 5(b), it is formed in the groove 12 and on the insulating layer 26 after eliminating the photoresist 58. The plug metal 34 coupled to the bit line 24 is formed in the interlayer insulating film 32. A wiring layer 36 is formed that is coupled to the plug metal 34 and extends above the bit line 24 in the same direction thereof. The wiring layer is further layered to complete production of the flash memory.

Referring to FIG. 3(a), in the method according to FIG. 1, the trap layer 16 formed of the silicon nitride film is eroded while eliminating the dummy layer 50 including the silicon nitride film as indicated by a reference numeral 40.

Figure 9A:
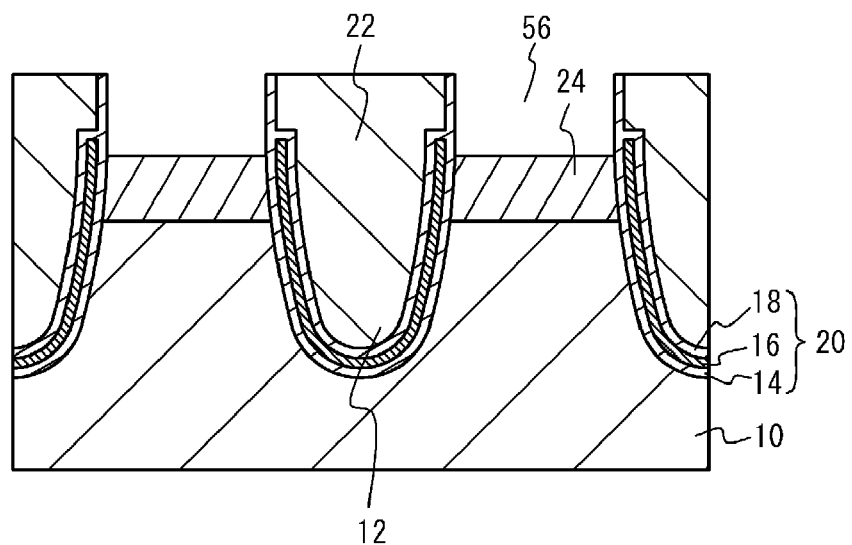
FIGS. 9(a) and 9(b) are sectional views showing an arsenic ion implantation in an exposed semiconductor substrate in a process for manufacturing an exemplary flash memory in accordance with various embodiments.
Figure 9B:
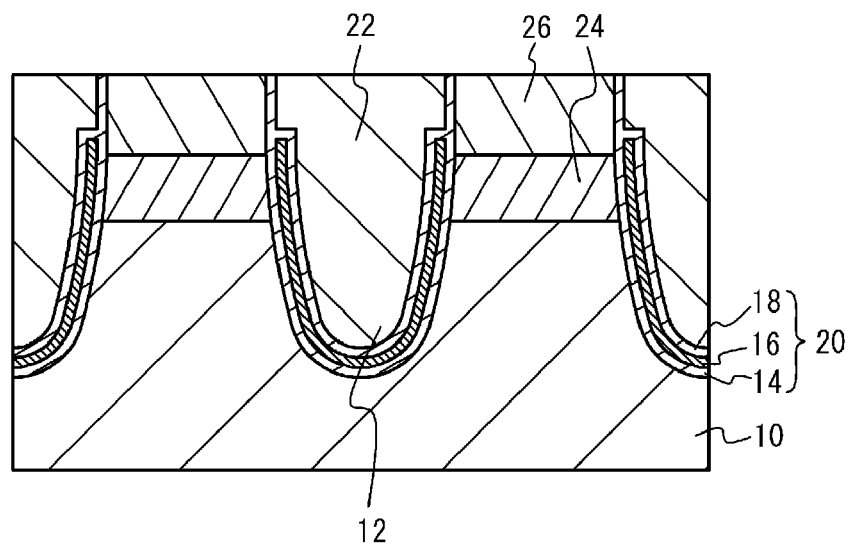
Figure 10A:
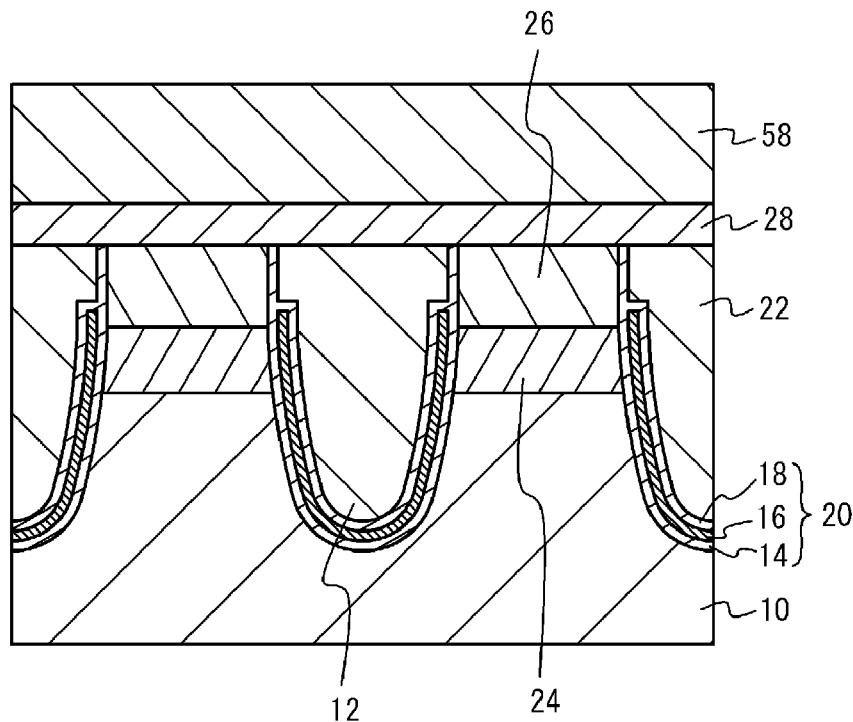
FIGS. 10(a) and 10(b) are sectional views showing the formation of a word-line-forming layer on the surfaces of a gate electrode and the insulating layer in a process for manufacturing an exemplary flash memory in accordance with various embodiments.
Figure 10B:
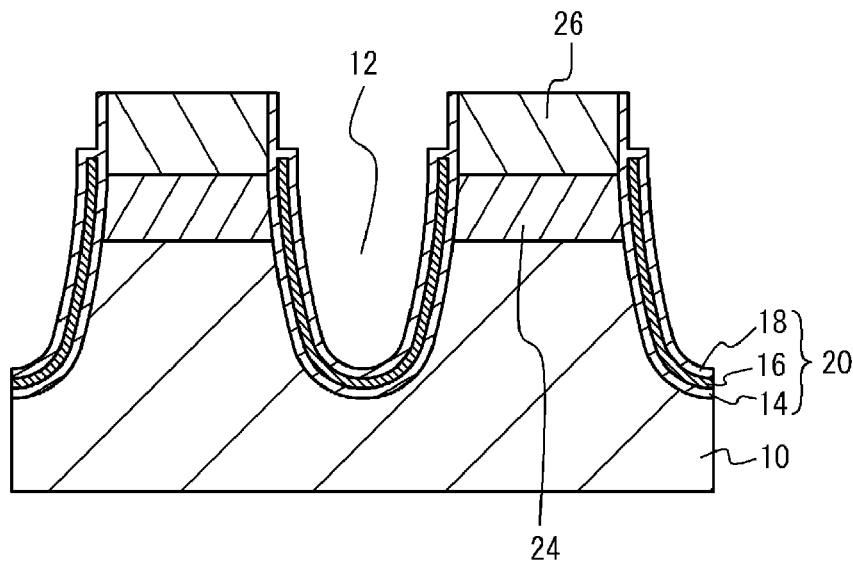
Figure 11A:
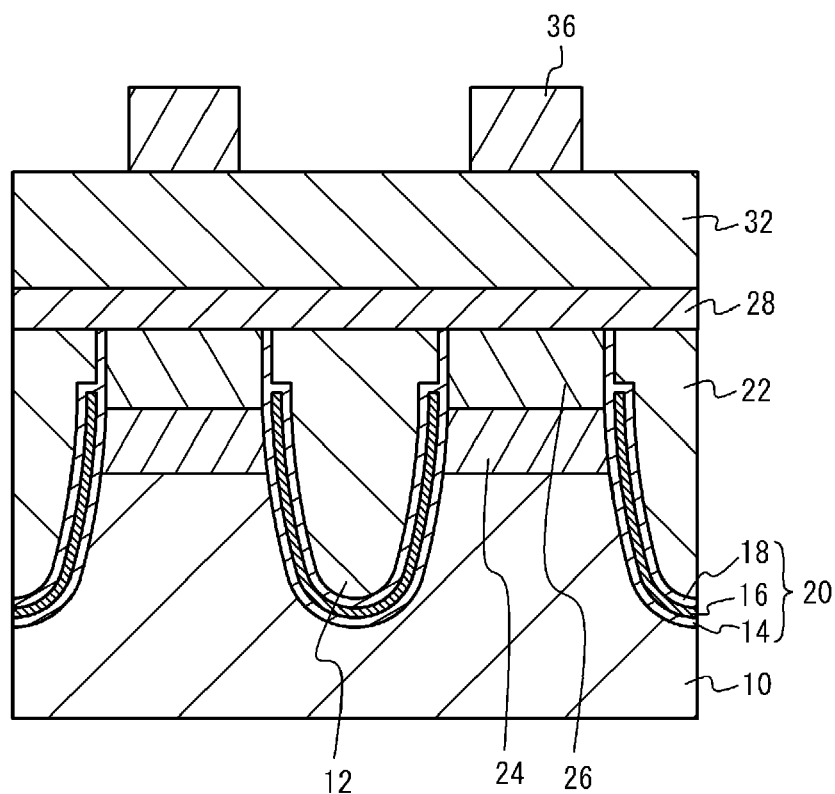
FIGS. 11(a) and 11(b) are sectional views showing the formation of an interlayer insulating film on a word line and inside a groove in a process for manufacturing an exemplary flash memory in accordance with various embodiments.
Figure 11B:
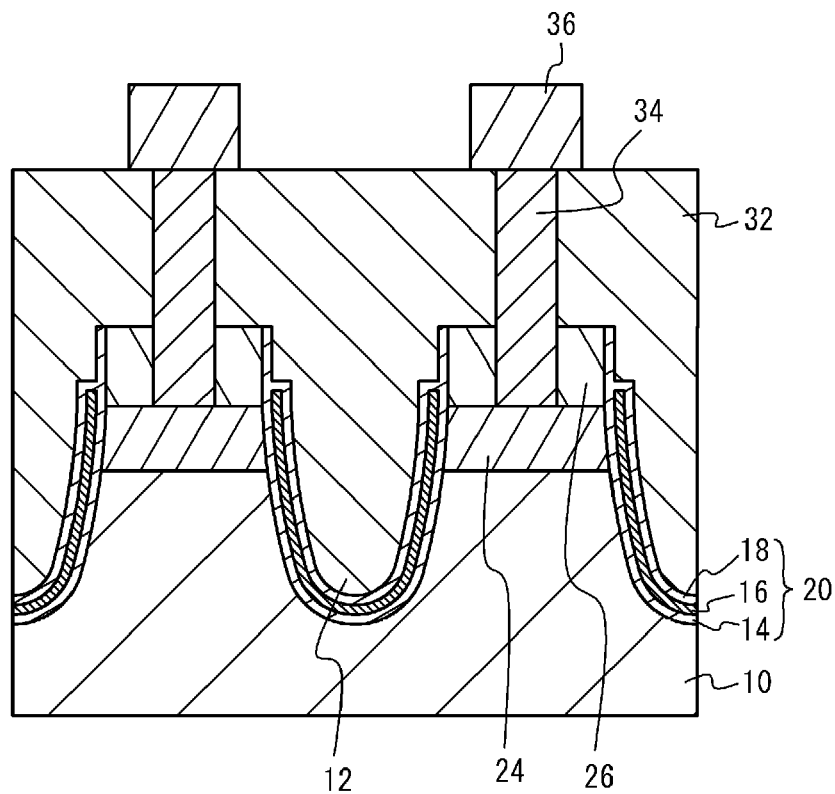

Referring to FIGS. 6(a) to 11(b), a method for manufacturing a flash memory according to one embodiment will be described. FIGS. 6(a) to 9(b) correspond to sectional views taken along lines A-A' and B-B' as shown in FIG. 1, respectively. FIGS. 10(a) and 11(a) correspond to sectional views taken along line A-A' as shown in FIG. 1. FIGS. 10(b) and 11(b) correspond to sectional views taken along line B-B' as shown in FIG. 1.

Figure 6A:
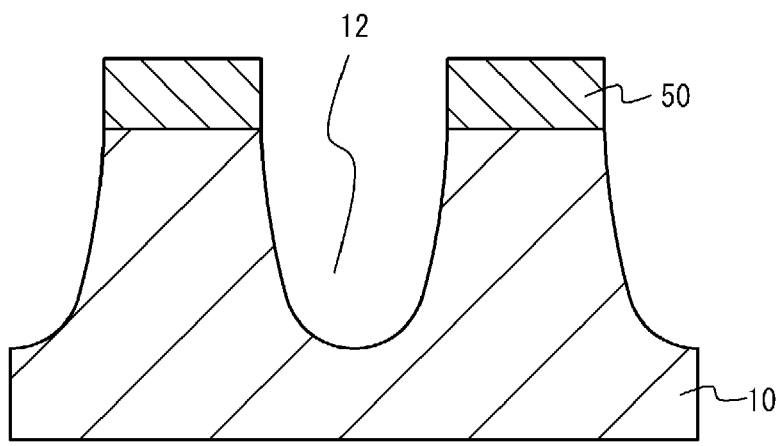
FIGS. 6(a) to 6(c) are sectional views showing the formation of a dummy layer on a p-type silicon semiconductor substrate in a process for manufacturing a flash memory in accordance with various embodiments.
Figure 6B:
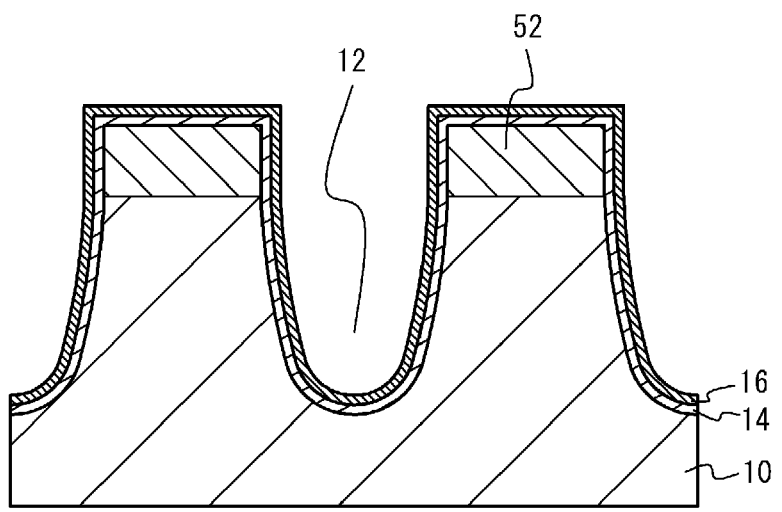
Figure 6C:
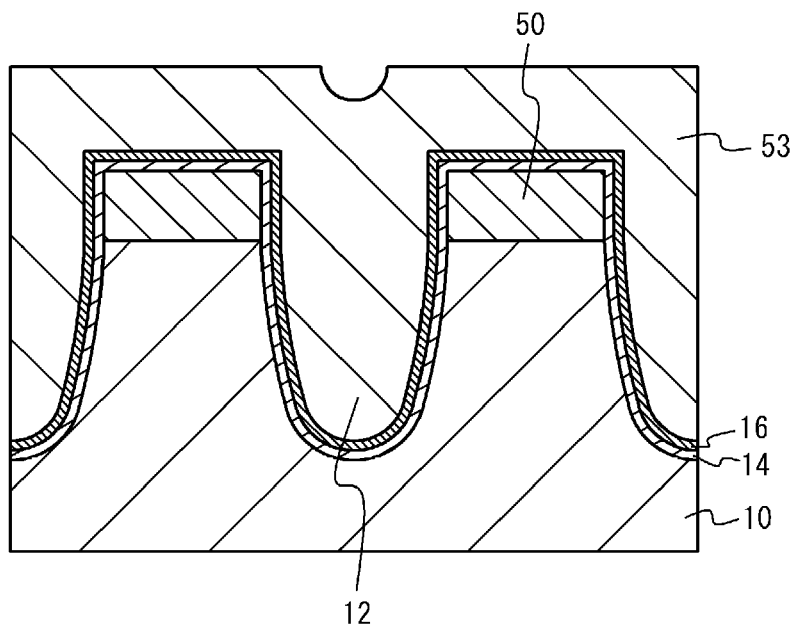

Referring to FIG. 6(a), a dummy layer 50 including a patterned silicon nitride film is formed on a p-type silicon semiconductor substrate (or p-type region inside the semiconductor substrate) 10. The dummy layer 50 is formed through a plasma CVD (Chemical Vapor Deposition) process and has the thickness ranging from 100 nm to 200 nm, for example. The semiconductor substrate 10 is etched while using the dummy layer 50 as a mask to form a groove 12 with a depth ranging from 100 nm to 200 nm, for example. Referring to FIG. 6(b), a tunnel insulating film 14 including the silicon oxide film is formed through the thermal oxidation process so as to cover the inner surface of the groove 12 and the outer surface of the dummy layer 50, and a trap layer 16 including the silicon nitride film is formed thereon through the plasma CVD process. Referring to FIG. 6(c), a bury-layer-forming layer 53 including the resist or the resin is formed to fill the groove 12 and to cover the trap layer 16.

Figure 7A:
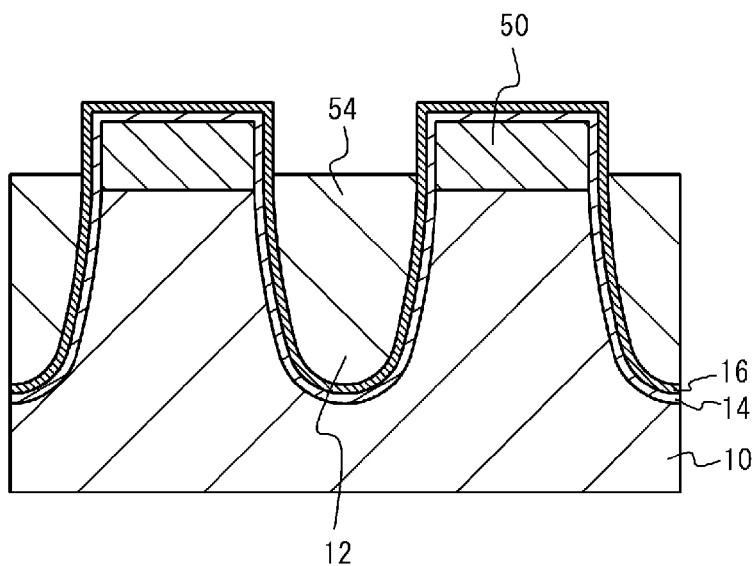
FIGS. 7(a) to 7(c) are sectional views showing the elimination of a bury-layer-forming layer in a process for manufacturing an exemplary flash memory in accordance with various embodiments.
Figure 7B:
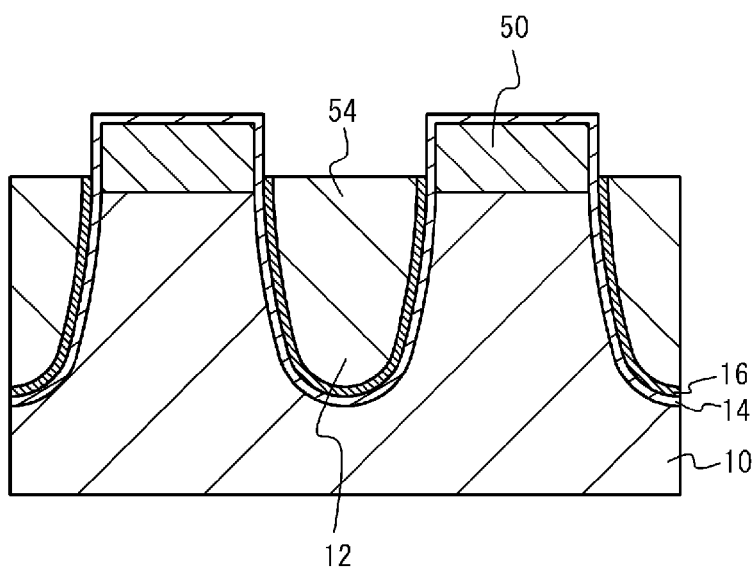
Figure 7C:
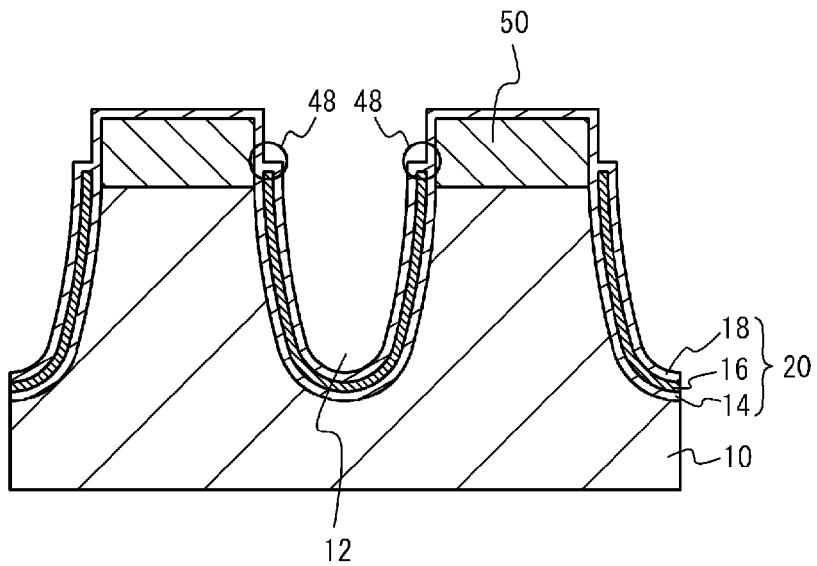

Referring to FIG. 7(a), the bury-layer-forming layer 53 is eliminated by ashing or etching so that the trap layer 16 formed above the upper surface and at the sides of the dummy layer 50 is exposed. The trap layer 16 above the upper surface and at the sides of the dummy layer 50 is exposed from a bury layer 54. The range of the trap layer 16 exposed from the bury layer 54 corresponds to that of the trap layer 16 to be eliminated. So the trap layer 16 formed at the sides of the dummy layer 50 may be partially or completely exposed. Referring to FIG. 7(b), the trap layer 16 is eliminated while using the bury layer 54 as the mask. The trap layer 16 formed above the upper surface and at the sides of the dummy layer 50 may be eliminated. Referring to FIG. 7(c), the bury layer 54 is eliminated, and a top insulating film 18 including the silicon oxide film is formed through the thermal oxidation process so as to cover the remaining trap layer 16 and the exposed tunnel insulating film 14. An ONO film 20 formed of the tunnel insulating film 14, the trap layer 16 and the top insulating film 18 is formed on the side surface of the groove 12.

Figure 8A:
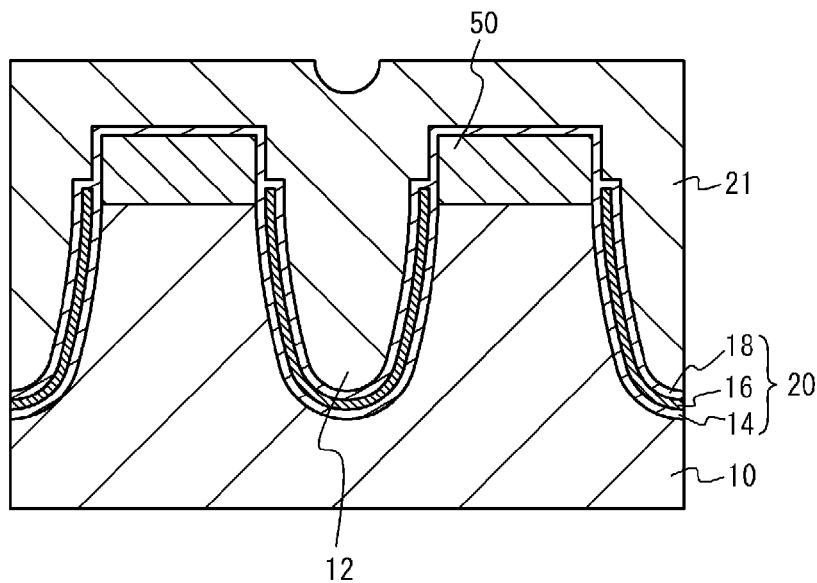
FIGS. 8(a) to 8(c) are sectional views showing the formation of a gate-electrode-forming layer in a process for manufacturing an exemplary flash memory in accordance with various embodiments.
Figure 8B:
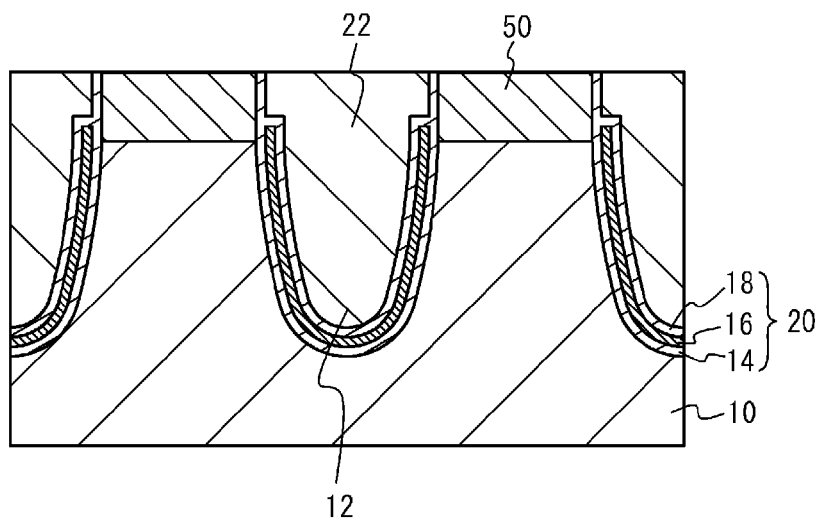
Figure 8C:
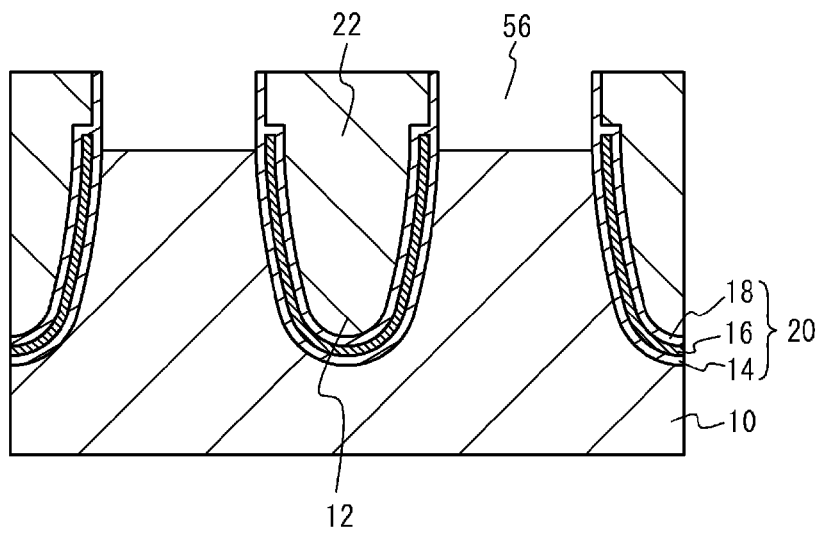

Referring to FIG. 8(a), a gate-electrode-forming layer 21 formed of polysilicon is produced through the CVD process so as to fill the groove 12 and to cover the top insulating film 18. Referring to FIG. 8(b), the gate-electrode-forming layer 21 is polished through the CMP (Chemical Mechanical Polish) process to be flush with the dummy layer 50. As the operation for polishing the silicon nitride film takes longer time compared with the operation for polishing the polysilicon film or the silicon oxide film, the dummy layer 50 functions as a stopper of the operation for polishing the gate-electrode-forming layer 21. Referring to FIG. 8(c), the dummy layer 50 is etched using a phosphoric acid. The space generated by eliminating the dummy layer 50 becomes a recess portion 56. The surface of the semiconductor substrate 10 is exposed as the bottom surface of the recess portion 56.

Referring to FIG. 9(a), the exposed semiconductor substrate 10 is subjected to an arsenic (As) ion implantation such that a bit line 24 is formed on the semiconductor substrate 10 between grooves 12 where the dummy layer 50 is eliminated. Referring to FIG. 9(b), an insulating layer 26 including the silicon oxide is formed to fill the recess portion 56. The insulating layer 26 is polished using a CMP process so as to be selectively formed in the recess portion 56.

Referring to FIGS. 10(a) and 10(b), a word-line-forming layer (not shown) including a polysilicon layer is formed on the surfaces of the gate electrode 22 and the insulating layer 26 using the CVD process. A patterned photoresist 58 is further formed on the word-line-forming layer. The word line 28 and the gate electrode 22 are eliminated while using the photoresist 58 as the mask. Referring to FIG. 10(a), the sectional view taken along line A-A', the word line 28 which intersects with the bit line 24 is formed. The word line 28 is electrically in contact with the gate electrode 22, and is electrically separated from the bit line 24 via the insulating layer 26. Referring to FIG. 10(b) as the sectional view taken along line B-B', the word line 28 and the bit line 24 are eliminated.

After eliminating the photoresist 58, an interlayer insulating film 32 (including the silicon oxide film, for example) is formed on the word line 28 as shown in FIG. 11(a), and inside the groove 12 and on the insulating layer 26 as shown in FIG. 11(b). A plug metal 34 formed of such material as tungsten coupled to the bit line 24 is formed inside the interlayer insulating film 32. The wiring layer 36 is formed that is coupled to the plug metal 34 and extends on the bit line 24 in the same direction thereof. Thereafter, the wiring layer is further layered to complete production of the flash memory.

In one embodiment, the tunnel insulating film 14 and the trap layer 16 are formed to cover the inner surface of the groove 12 and the surface of the dummy layer 50 as shown in FIG. 6(b). Referring to FIG. 7(b), the trap layer 16 formed above the upper surface and at the sides of the dummy layer 50 is eliminated. Referring to FIG. 7(c), the top insulating film 18 is formed to cover the remaining trap layer 16 and the exposed tunnel insulating film 14. In the aforementioned manufacturing process, an end portion 48 of the trap layer 16 is covered with the top insulating film 18 as shown in FIG. 7(c). Accordingly, erosion of the trap layer 16 can be suppressed when the dummy layer 50 is eliminated.

Upon elimination of the trap layer 16, the bury layer 54 is formed in the groove 12 so as to expose the trap layer 16 at the sides of the dummy layer 50 as shown in FIG. 7(a). Thereafter, the trap layer 16 is eliminated while using the bury layer 54 as the mask. This makes it possible to selectively eliminate the trap layer 16 formed above the upper surface and the sides of the dummy layer 50.

Upon formation of the bury layer 54, the bury-layer-forming layer 53 is formed to fill the groove 12 and to cover the trap layer 16 as shown in FIG. 6(c). Then the bury-layer-forming layer 53 is eliminated such that the trap layer 16 at the side of the dummy layer 50 is exposed as shown in FIG. 7(a). Thus, the bury layer 54 may be formed in the groove 12 so as to expose the trap layer 16 at the sides of the dummy layer 50.

Referring to FIG. 8(a), the gate-electrode-forming layer 21 is formed to fill the groove 12 and to cover the top insulating film 18. Referring to FIG. 8(b), the gate-electrode-forming layer 21 is polished until it becomes flush with the dummy layer 50. Referring to FIG. 8(c), the dummy layer 50 is eliminated. The ion implantation is performed to the semiconductor substrate 10 while using the gate electrode 22 as the mask such that the bit line 24 is formed on the semiconductor substrate 10 between the grooves 12 where the dummy layer 50 has been eliminated as shown in FIG. 9(a). In the aforementioned process, the bit line 24 may be formed such that the upper surface thereof is lower than the upper surface of the gate electrode 22 by the amount corresponding to the film thickness of the dummy layer 50. The upper surface of the gate electrode 22 is kept exposed.

Referring to FIG. 9(b), the insulating layer 26 is formed on the bit line 24 so as to expose the upper surface of the gate electrode 22. Referring to FIG. 10(a), the word line 28 coupled to the gate electrode 22 is formed on the insulating layer 26. As a result, the word line 28 is electrically coupled with the gate electrode 22 and is electrically separated from the bit line 24 via the insulating layer 26.

According to this embodiment, each of the dummy layer 50 and the trap layer 16 is formed of the silicon nitride. However, any material may be used for forming the trap layer 16 so long as it is eroded upon etching of the dummy layer 50, thus providing the same effects as those derived from the previously described embodiments. For example, the same material may be used for forming both the dummy layer 50 and the trap layer 16.

Figure 12:
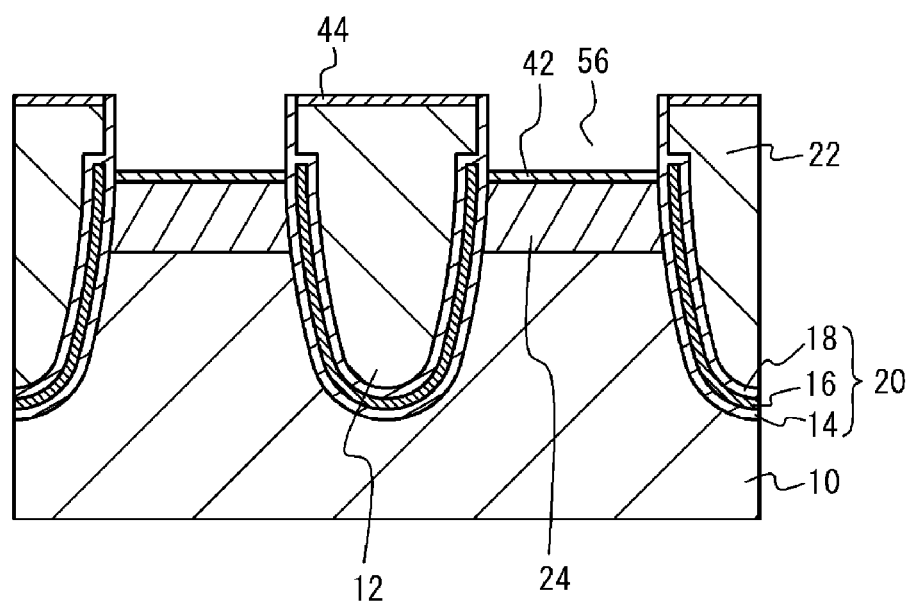
FIG. 12 is a sectional view showing the formation of a metal layer on the inner surface of a recess portion in a process for manufacturing an exemplary flash memory in accordance with various embodiments.
Figure 13A:
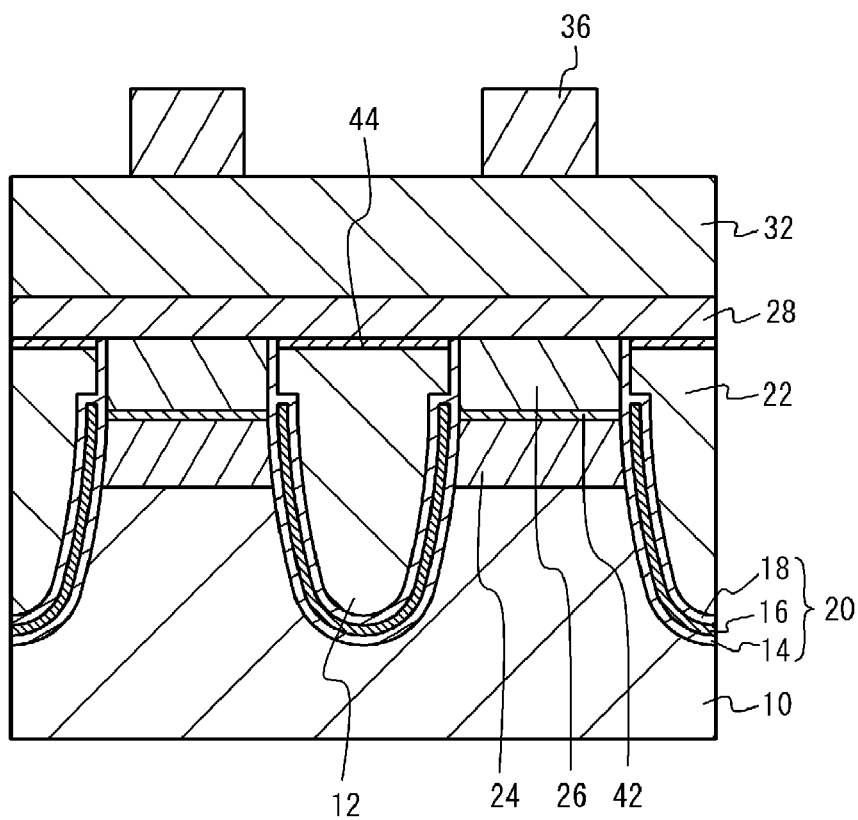
FIGS. 13(a) and 13(b) are sectional views showing the completion of a process for manufacturing the flash memory according to various embodiments.
Figure 13B:
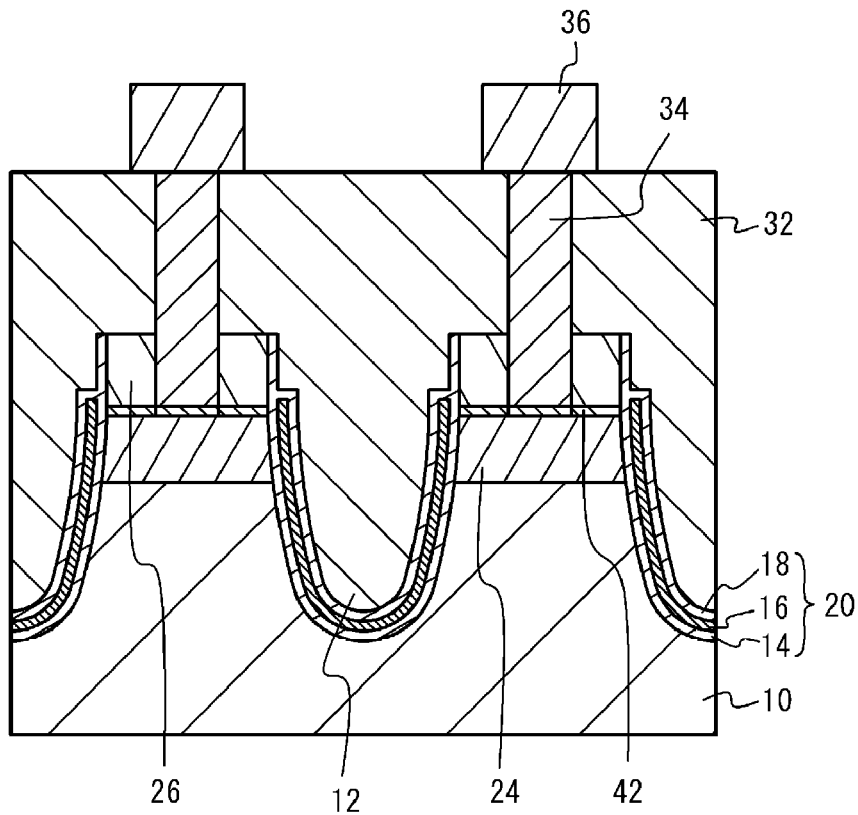

In a further embodiment, a metal silicide layer is formed on the bit line. Referring to FIGS. 12 to 13(*b*), a method for manufacturing a flash memory according to another embodiment will be described. FIG. 12 corresponds to a sectional view taken along lines A-A' and B-B' shown in FIG. 1. FIG. 13(*a*) corresponds to a sectional view taken along line A-A' shown in FIG. 1, and FIG. 13(*b*) corresponds to a sectional view taken along line B-B' shown in FIG. 1.

Referring to FIG. 12, after performing the process according to the embodiment shown in FIG. 9(*a*), a metal layer, for example, a cobalt layer or titanium layer (not shown) is formed on the inner surface of the recess portion 56 and above the upper surface of the gate electrode 22. Thereafter, the thermal processing is performed such that the metal layer on the bit line 24 and the gate electrode 22 is formed into the silicide to become metal silicide layers 42 and 44. The metal layer which is not formed into silicide is eliminated. Referring to FIGS. 13(*a*) and 13(*b*), the process according to the embodiment shown in FIGS. 9(*b*) to 11(*b*) is performed to complete production of the flash memory according to a further embodiment.

In one embodiment, after the dummy layer 50 is eliminated, the metal silicide layer 42 is formed on the bit line 24 between the grooves 12 where the dummy layer 50 has been eliminated. In this way, after forming the bit line 24, the metal silicide layer 42 may be continuously formed along the extending direction of the bit line 24. So the bit line resistance may be reduced. Simultaneously with the formation of the metal silicide layer 42, the metal silicide layer 44 may be formed on the gate electrode 22, thus reducing the gate resistance.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for manufacturing a semiconductor device comprising:
    forming a dummy layer on a semiconductor substrate;
    forming a groove in the semiconductor substrate while using the dummy layer as a mask;
    forming a tunnel insulating film and a trap layer to cover an inner surface of the groove and the dummy layer;
    forming a bury layer in the groove and over the trap layer, wherein portions of the trap layer formed over sides of the dummy layer are exposed;
    eliminating the trap layer formed above an upper surface of the dummy layer, and at sides of the dummy layer; and
    forming a top insulating film to cover a remaining trap layer and an exposed tunnel insulating film.

2. The method according to claim 1, wherein eliminating the trap layer comprises:
    eliminating the trap layer while using the bury layer as a mask.

3. The method according to claim 2, wherein forming a bury layer comprises:
    forming a layer to be formed as the bury layer to fill the groove and to cover the trap layer; and
    eliminating the layer to be formed as the bury layer to expose at least the trap layer at the sides of the dummy layer.

4. The method according to claim 1, further comprising:
    eliminating the dummy layer; and
    forming a bit line in the semiconductor substrate between the grooves where the dummy layer has been eliminated.

5. The method according to claim 4, further comprising forming a gate electrode buried in the groove on the top insulating film, wherein forming the bit line comprises performing an ion implantation to the semiconductor substrate while using the gate electrode as a mask.

6. The according to claim 5, wherein forming the gate electrode comprises:
    forming a layer to be formed as a gate electrode to fill the groove and to cover the top insulating film, and
    polishing the layer to be formed as the gate electrode to be flush with the dummy layer.

7. The method according to claim 5, further comprising the steps of:
    forming an insulating layer on the bit line to expose an upper surface of the gate electrode; and
    forming a word line which is coupled to the gate electrode and intersects with the bit line in a direction of an extension thereof on the insulating layer.

8. The method according to claim 4, further comprising forming a metal silicide layer on the bit line between the grooves where the dummy layer has been eliminated.

9. The method for according to claim 1, wherein the dummy layer and the trap layer are formed from a same material.

10. The method according to claim 1, wherein a silicon nitride is used for forming the dummy layer and the trap layer.

* * * * *